(12) United States Patent
Redpath et al.

(10) Patent No.: US 10,047,929 B2
(45) Date of Patent: Aug. 14, 2018

(54) SYSTEM AND METHOD OF GENERATING PERCEIVED WHITE LIGHT

(71) Applicant: Parhelion Incorporated, Wilmington, DE (US)

(72) Inventors: Richard Redpath, Cary, NC (US); James Redpath, Cary, NC (US)

(73) Assignee: James Redpath, Cary, NC (US)

(*) Notice: Subject to any disclaimer, the term of this patent is extended or adjusted under 35 U.S.C. 154(b) by 357 days.

(21) Appl. No.: 14/855,503

(22) Filed: Sep. 16, 2015

(65) Prior Publication Data
US 2017/0074466 A1    Mar. 16, 2017

(51) Int. Cl.
| | |
|---|---|
| *F21V 3/08* | (2018.01) |
| *G02B 27/09* | (2006.01) |
| *F21S 9/02* | (2006.01) |
| *F21V 3/06* | (2018.01) |
| *G02B 27/10* | (2006.01) |
| *G02B 27/42* | (2006.01) |
| *F21K 9/64* | (2016.01) |
| *H01S 5/00* | (2006.01) |
| *F21Y 115/30* | (2016.01) |

(52) U.S. Cl.
CPC ............... *F21V 3/08* (2018.02); *F21K 9/64* (2016.08); *F21S 9/022* (2013.01); *F21V 3/062* (2018.02); *G02B 27/0944* (2013.01); *G02B 27/106* (2013.01); *G02B 27/1093* (2013.01); *G02B 27/425* (2013.01); *H01S 5/005* (2013.01); *F21Y 2115/30* (2016.08)

(58) Field of Classification Search
CPC ......... C09K 11/0883; F21K 9/56; F21K 9/64; F21V 29/502
USPC ............................. 257/98, E33.031; 362/84
See application file for complete search history.

(56) References Cited

U.S. PATENT DOCUMENTS

| | | | | |
|---|---|---|---|---|
| 4,185,891 A | * | 1/1980 | Kaestner | G02B 27/09 313/500 |
| 5,070,505 A | * | 12/1991 | Dixon | H01S 3/0627 359/326 |
| 2009/0175050 A1 | * | 7/2009 | Marttila | B29D 11/00663 362/551 |
| 2013/0128492 A1 | * | 5/2013 | Drenten | F21V 9/16 362/84 |
| 2013/0270992 A1 | * | 10/2013 | Gleitsmann | C09K 11/02 313/483 |

* cited by examiner

*Primary Examiner* — Robert May
*Assistant Examiner* — Leah S Macchiarolo
(74) *Attorney, Agent, or Firm* — Ming Chow; Sinorica, LLC (57) ABSTRACT

A system and method of generating perceived white light by laser. The system comprises a laser, a phosphoric substrate, and optionally a diffraction grating. In one embodiment, a blue laser beam from the laser penetrates the phosphoric substrate to create perceived white light in a Gaussian distribution appropriate for emergency lighting. In another embodiment, the blue laser beam is split into multiple beams by the diffraction grating. The multiple beams penetrate the phosphoric substrate to create perceived white light in a Gaussian distribution appropriate for emergency lighting.

13 Claims, 14 Drawing Sheets

SYSTEM AND METHOD OF GENERATING PERCEIVED WHITE LIGHT

BACKGROUND

1. Field of Invention

This invention relates generally to systems and methods for perceived white source lighting. More particularly, this invention relates to laser lighting systems for high efficiency white light source generation in emergency settings.

2. Description of Related Art

The generation of white light is essential in certain emergency situations when ambient light is not present. Emergency lighting devices must be capable of providing substantially white, long lasting, and appropriately distributed light to meet safety objectives.

Incandescent lighting is one of the oldest forms of emergency lighting and has a notable disadvantage of power inefficiency, leading to short illumination time when battery power is limited. Also, incandescent lighting is not as bright as some of the more modern light sources.

Current white lighting devices include apparatuses comprising light emitting diodes (LED's) and one or more phosphors. Blue light from one or more LED's penetrate the phosphors to generate perceived white light. Since each LED is capable of providing only a small quantity of light, multiple LED's must be combined and focused using a plastic lens system built into a solid state unit. The lens system leads to a much narrower Gaussian distribution of light than is desired for emergency situations. These systems have a disadvantage of high power consumption, leading to short operating duration. Longevity is essential, especially in the developing world where power may be turned off for hours.

Laser diodes are another candidate for generating white light in a similar manner to LED's, however laser diodes also suffer from poor energy efficiency. Laser diode systems require a lens or reflector system in addition to a yellow phosphorous radiant conversion system, which leads to losses when using a low powered laser diode. Moreover, they pose a safety hazard if a system container is damaged. Current laser diode systems are suitable for high intensity applications such as automobile headlights, however due to efficiency limitations they are not well adapted to provide low level light with a light distribution appropriate for emergency situations.

Therefore, it is an object of the present invention to provide a system and method for producing high efficiency perceived white light emergency lighting. It is another object of the present invention to provide perceived white light in a bell shaped Gaussian curve appropriate for emergency lighting.

SUMMARY OF THE INVENTION

In one aspect of the system of the present invention, the system comprises a laser diode, a collimator, and a phosphoric substrate. The collimator is coupled to the laser diode. The phosphoric substrate is positioned collinearly with the laser diode to receive a laser beam therefrom. In one embodiment, a diffraction grating is positioned between the collimator and the phosphoric substrate.

In an exemplary embodiment, the system further comprises an emergency light control adapted to control an output of the laser diode. In another embodiment, the system further comprises a battery charging system configured to provide power to the laser diode.

In one embodiment of the present invention, the system does not comprise a lens. In another embodiment, the system does not comprise a reflector.

In one aspect of the method of the present invention, a laser diode is provide with a collimator and directed at a phosphoric substrate. In an exemplary embodiment, a diffraction grating is provided between the collimator and the phosphoric substrate.

In an exemplary embodiment, an emergency light control adaptor is provided to control output of the laser diode. In another embodiment, a battery charging system is provided to power the laser diode.

In one embodiment of the present invention, no lens is provided. In another embodiment, no reflector is provided. Not having lenses or reflectors provides an advantage of reduced system losses. Not having lenses or reflectors provides an additional advantage of reduced manufacturing time and expenses.

As an optional feature of the present invention, the laser diode, collimator, substrate, and diffraction grating are contained inside a housing of a lightbulb. In one aspect, the system further comprises a thermal management system.

In one embodiment, a distance between the diffraction grating and the substrate is less than 10 microns. In another embodiment, the laser diode and collimator produce an output of at least 55 mw.

In the method of the present invention, a laser beam from the laser diode and collimator penetrates the phosphoric substrate. In some embodiments, the laser beam is blue and the phosphoric substrate comprises yellow phosphorous.

An optional step in the method of the present invention comprises positioning the laser, diffraction grating, and substrate inside a housing of a lightbulb. In one aspect, a thermal management system is provided.

The system and method of the present invention produce perceived white light in a Gaussian distribution.

The present invention offers the advantages of providing an efficient white light source in a bell shaped Gaussian curve without relying on an elaborate optical system. Further, the present invention allows for thermal management by virtue of allowing laser components to be placed at a great distance from substrate components.

DETAILED DESCRIPTION

Embodiments of the present invention provide systems and methods employing a laser and a substrate to generate perceived white light. In particular, a laser beam penetrates a phosphorous layer of the substrate to generate the perceived white light. In the following description, for purposes of explanation, specific details are set forth in order to provide an understanding of the invention. It will be apparent, however, to one skilled in the art that the invention can be practiced without these details. One skilled in the art will recognize that embodiments of the present invention, described below, may be performed in a variety of ways and using a variety of structures. Those skilled in the art will also recognize additional modifications, applications, and embodiments are within the scope thereof, as are additional fields in which the invention may provide utility. Accordingly, the embodiments described below are illustrative of specific embodiments of the invention and are meant to limit the scope of the invention.

Figure 1:
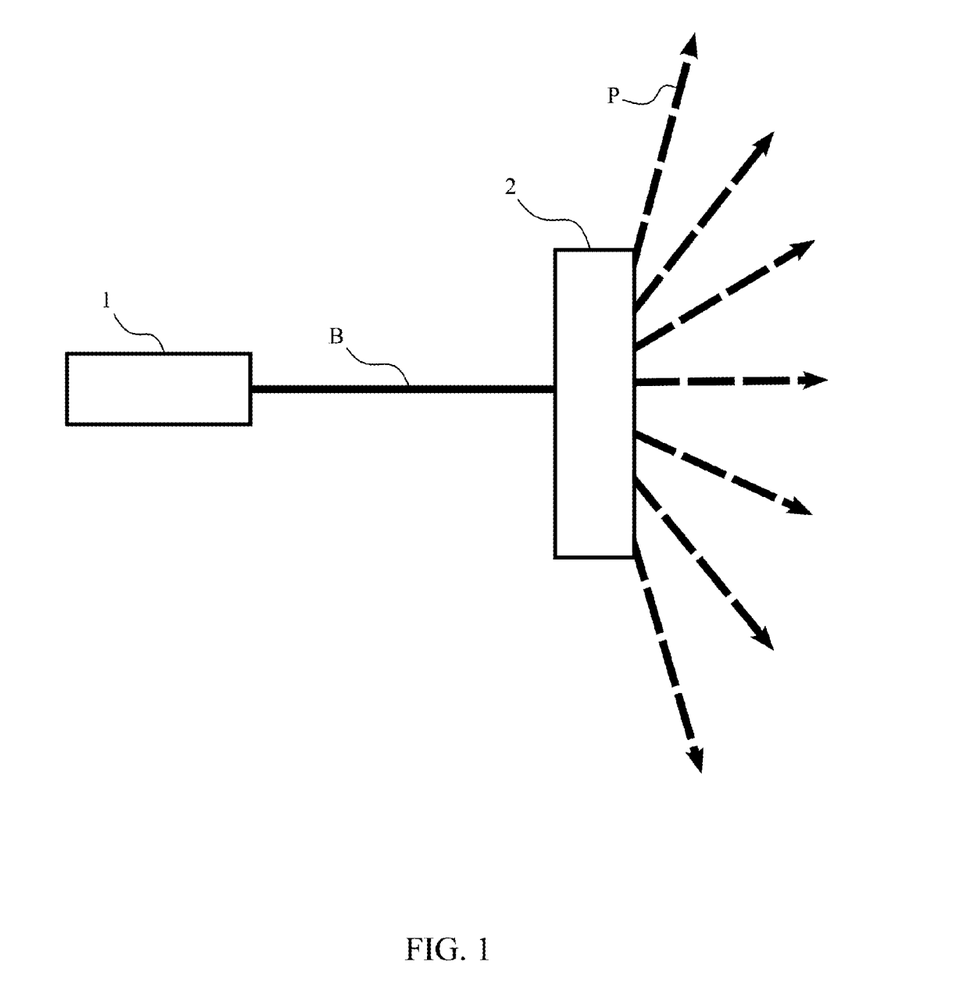
FIG. 1 is a schematic of the laser lighting system according to one embodiment of the present invention.
Figure 12:
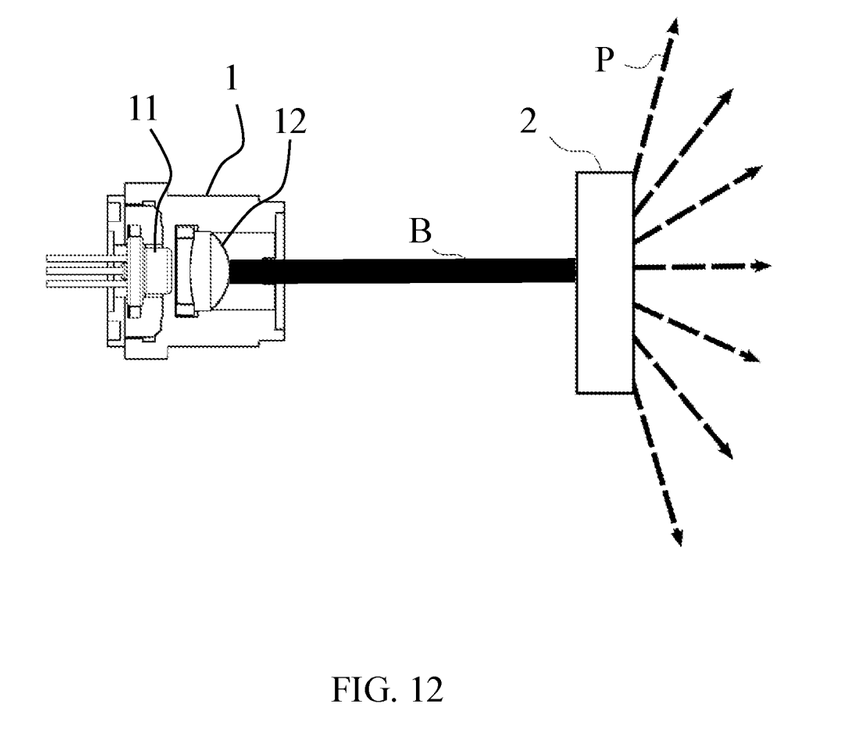
FIG. 12 is a detailed schematic of the laser lighting system of FIG. 1.

FIG. 1 and FIG. 12 illustrate one embodiment of the present invention. A laser (laser beam source) 1 is positioned at a distance from a substrate 2. The laser beam source 1 comprises a laser module, the laser module comprises a collimator 12 and a laser diode 11 coupled to the laser diode each other. A laser beam B is emitted from the laser module of the laser beam source 1. The laser beam B penetrates the substrate 2, which comprises a clear plastic layer 21 and a yellow phosphate layer 22. Perceived white light P is emitted from the substrate 2.

The laser beam B is highly collimated coherent light. When it impacts the substrate 2, the laser beam is refracted into spatial light as if from a common incandescent light source producing white light. In one embodiment, the laser beam B impacts the substrate 2 at a 90 degree angle. In some embodiments, the system has an angle of illumination of 180 degrees.

Figure 2:
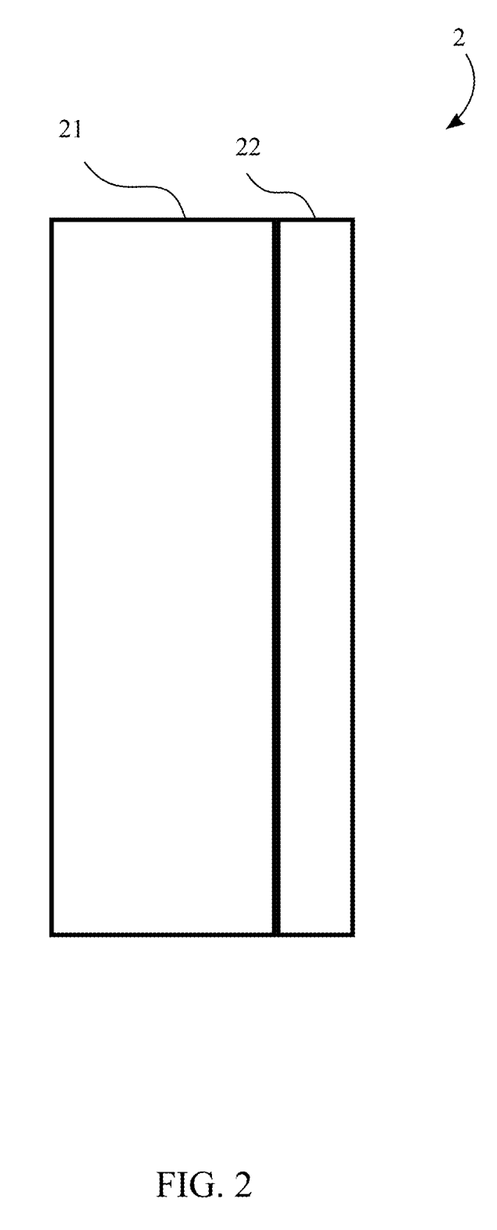
FIG. 2 is a side view of the substrate.

Referring to FIG. 2, the substrate 2 is shown in more detail. The substrate 2 comprises a clear plastic layer 21. In one embodiment, the clear plastic layer 21 as a depth of 1 mm. However, it will be appreciated by those skilled in the art that there are many suitable thicknesses of the plastic layer 21. The substrate 2 further comprises a yellow phosphorous layer 22. Blue light of the laser beam B penetrating the yellow phosphorous layer 22 will cause perceived white light. It will be appreciated by those skilled in the art that the yellow phosphorous layer 22 can be positioned on either side of the clear plastic 21. Testing has revealed that performance is unchanged regardless of which side the yellow phosphorous layer 22 is positioned with respect to the laser. An inwardly facing yellow phosphorous layer 22 is preferred because the clear plastic layer 21 protects the yellow phosphorous layer 22 from the environment.

Figure 3:
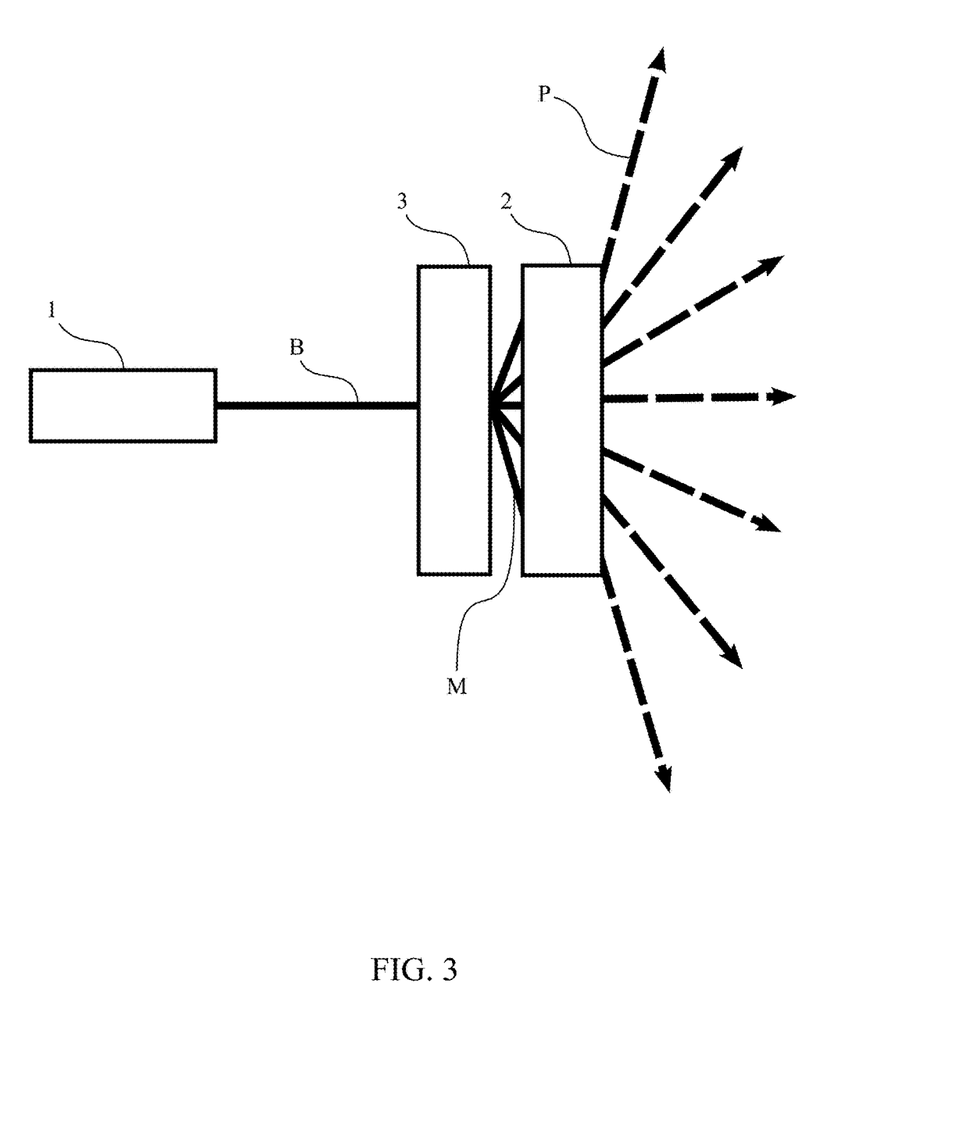
FIG. 3 is a schematic of the laser lighting system according to an alternative embodiment of the present invention.
Figure 13:
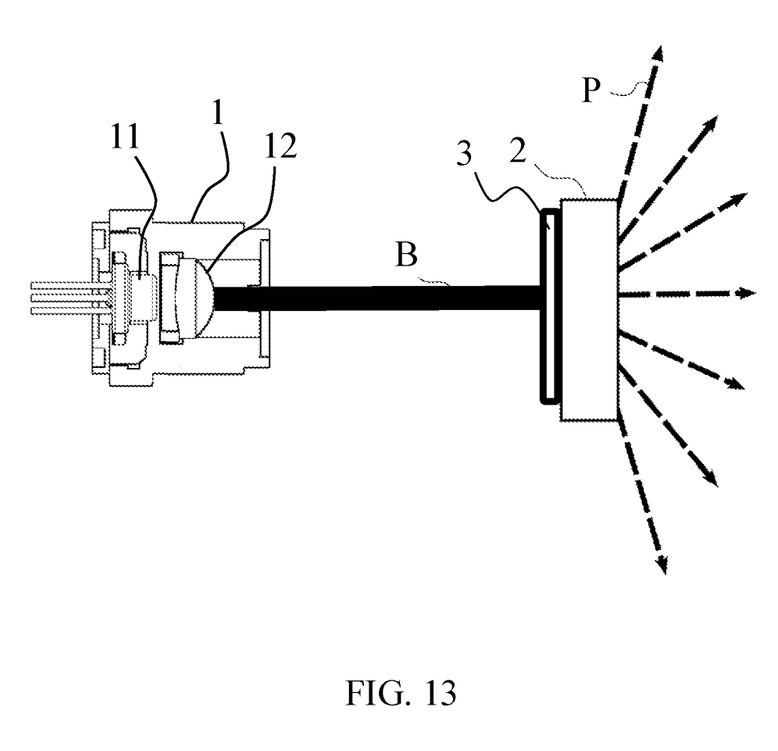
FIG. 13 is a detailed schematic of the laser lighting system of FIG. 3.

In an alternative embodiment, a diffraction grating 3 is introduced into the system, as shown in FIG. 3 and FIG. 13. The diffraction grating 3 is positioned very close to the substrate 2. In some embodiments, the diffraction grating 3 is less than 10 microns from the substrate 2. A laser beam B from the laser 1 is split into multiple beams M by the diffraction grating 3. The multiple beams M penetrate the substrate 2 at different locations on the substrate. Perceived white light P is emitted from the substrate.

Figure 4:
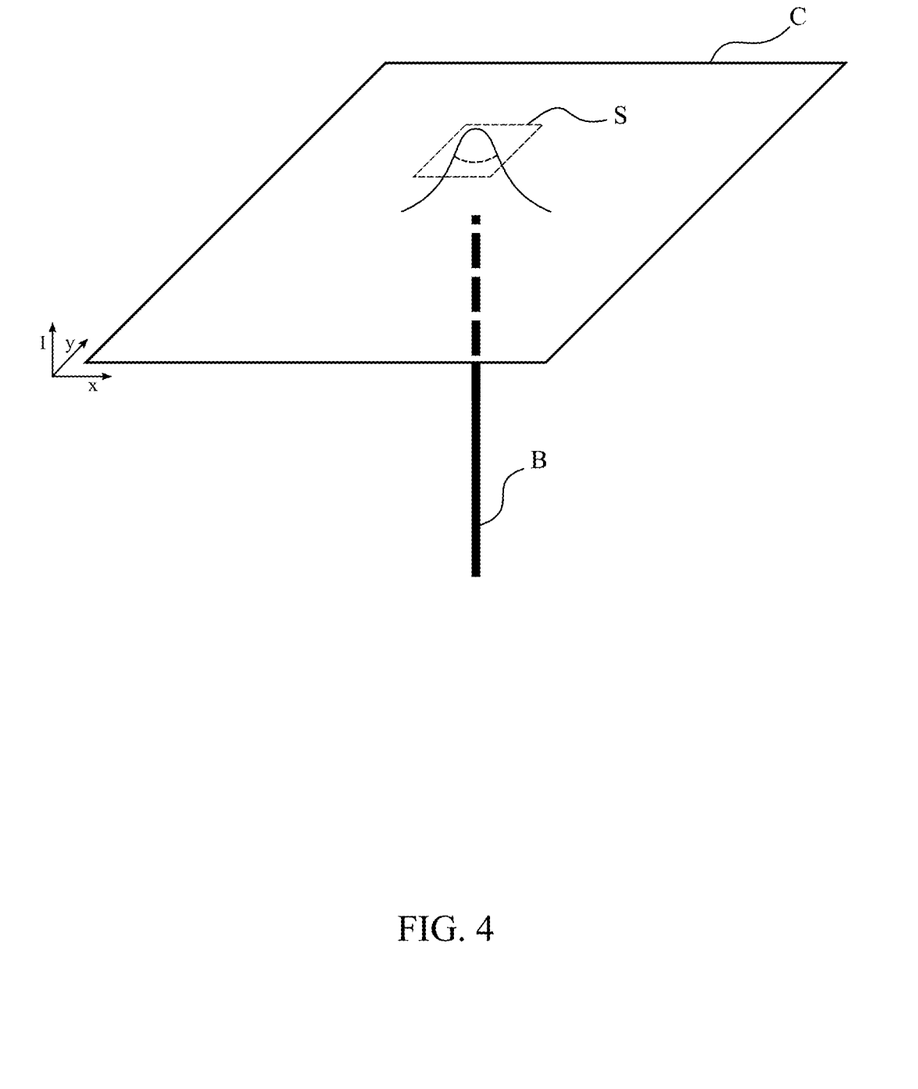
FIG. 4 is an illustration of the radiant output of the substrate according to the embodiment of FIG. 1.

The embodiment of FIG. 3 has a notable advantage of reducing or preventing saturation. The substrate 2 does not have infinite radiant output capacity, and will therefore become saturated if a radiant flux of laser light becomes sufficiently high within a given area of substrate. Beyond a certain intensity of blue laser light, perceived white light will no longer increase, because yellow light output intensity from the substrate 2 will no longer increase. This phenomena is illustrated in FIG. 4. A laser beam B impacts the substrate 2 (not shown), and the substrate 2 will emit light with an intensity (I) plane C, which is a function of x and y position on the substrate 2. There is a saturation intensity S, at which no additional white light will be produced with additional laser beam B intensity. In the example of FIG. 1, the substrate 2 is saturated.

Figure 5:
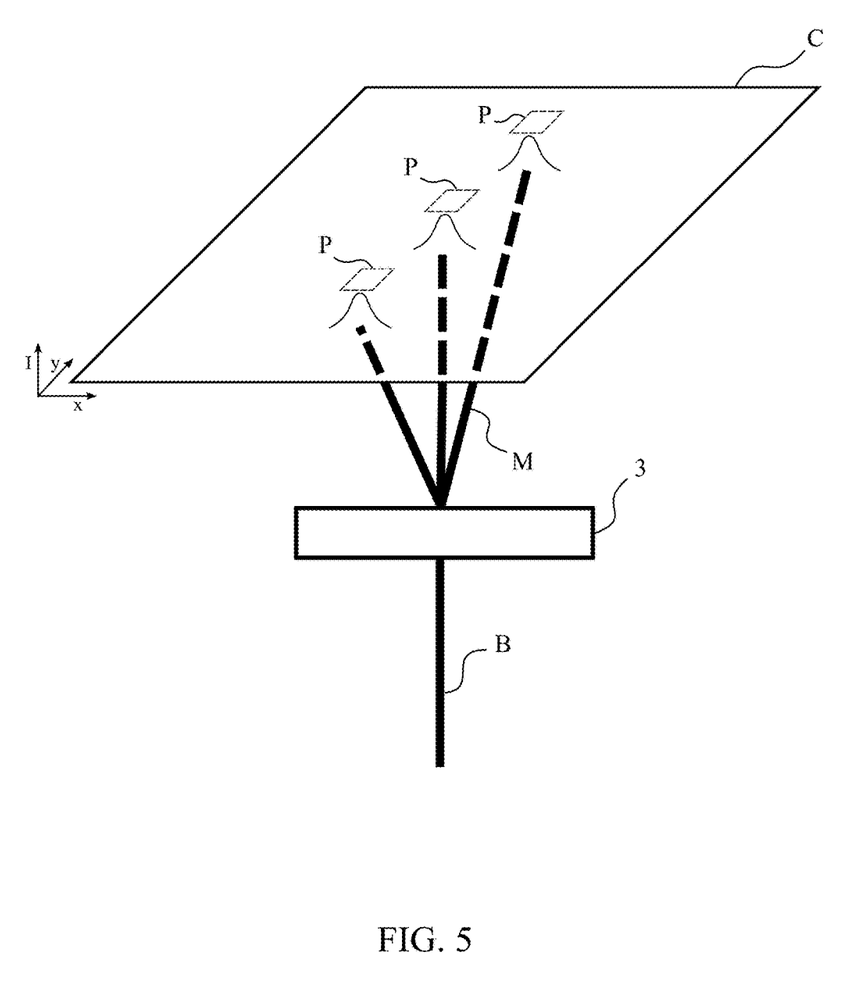
FIG. 5 is an illustration of the radiant output of the substrate according to the embodiment of FIG. 3.

Saturation may be avoided by implementing the embodiment of FIG. 3. As shown in FIG. 5, a laser beam B is split into multiple beams M when it passes through a diffraction grating 3. The multiple beams M impacts the substrate 2 (not shown), and the substrate 2 will emit light with an intensity (I) plane C, which is a function of x and y position on the substrate 2. The saturation intensity S is also shown in FIG. 5. In this example, saturation is not reached because the multiple beams M are distributed over the substrate 2. Therefore, the radiant flux in any given area will not become sufficiently high to cause saturation.

Figure 6:
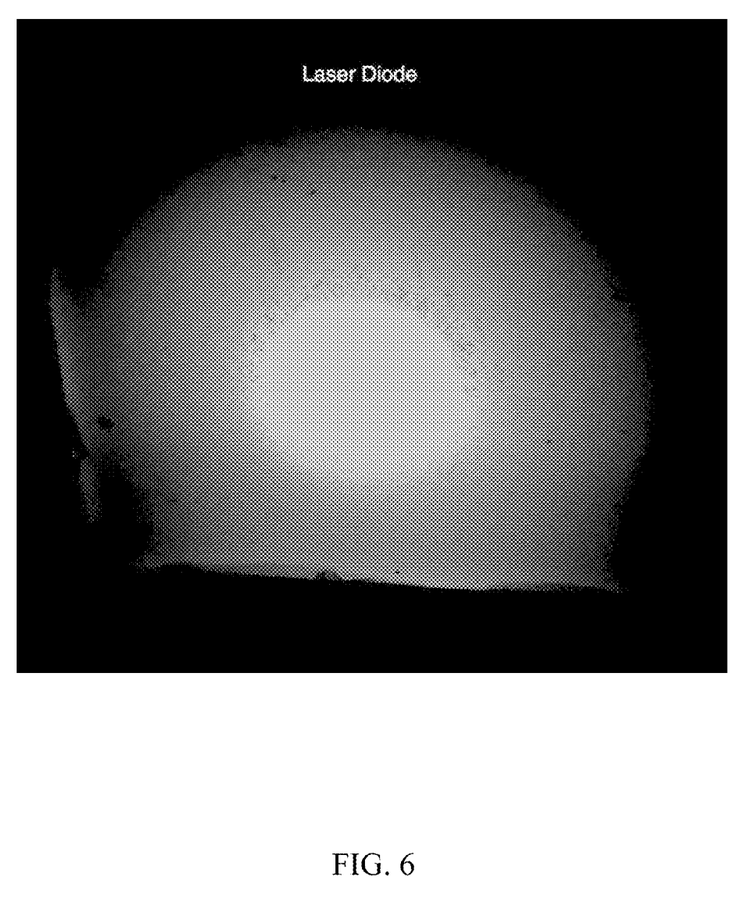
FIG. 6 is an image of perceived white light output according to an embodiment of the present invention.
Figure 7:
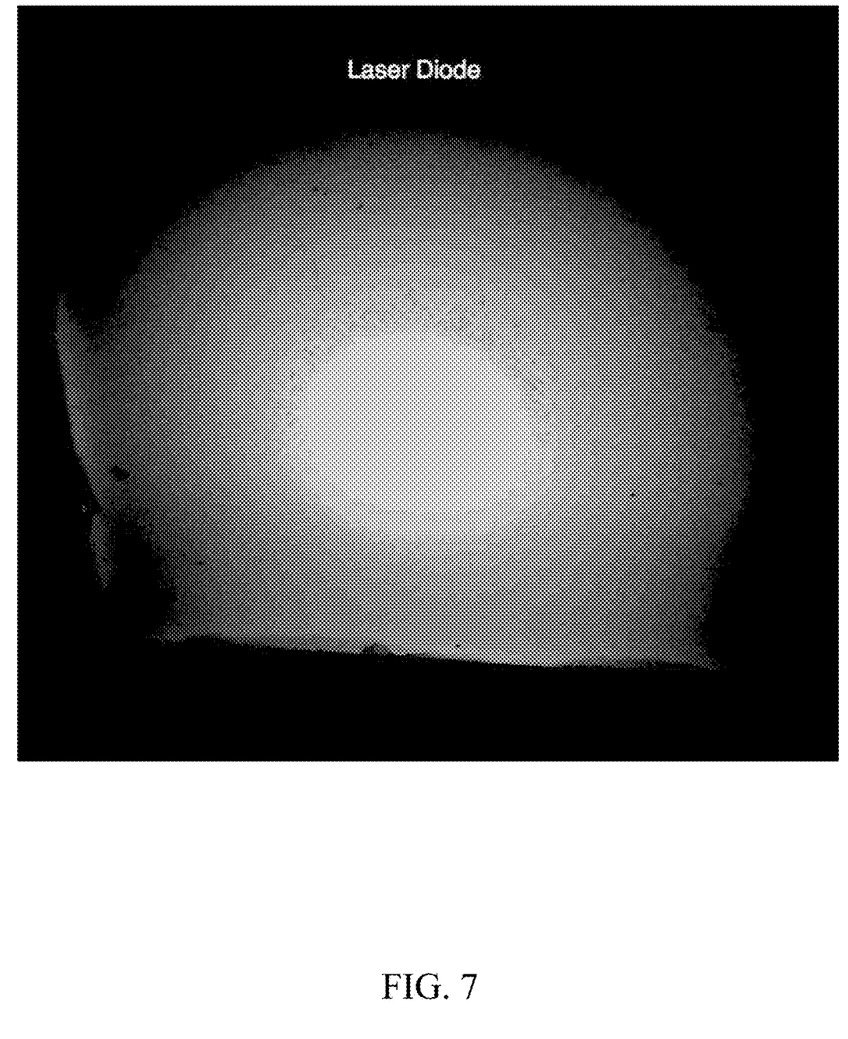
FIG. 7 is a posterized image of perceived white light output according to the embodiment of FIG. 6.

Embodiments of the present invention including a collimator are preferred based on experimental data. Referring now to FIG. 6, an image of perceived white light output is shown for an embodiment having only a laser diode and a substrate. FIG. 7 shows a posterized image of the same. The distribution of light shown in FIGS. 6 and 7 is less preferred because it is fanned out and is more appropriate for surface lighting.

Figure 8:
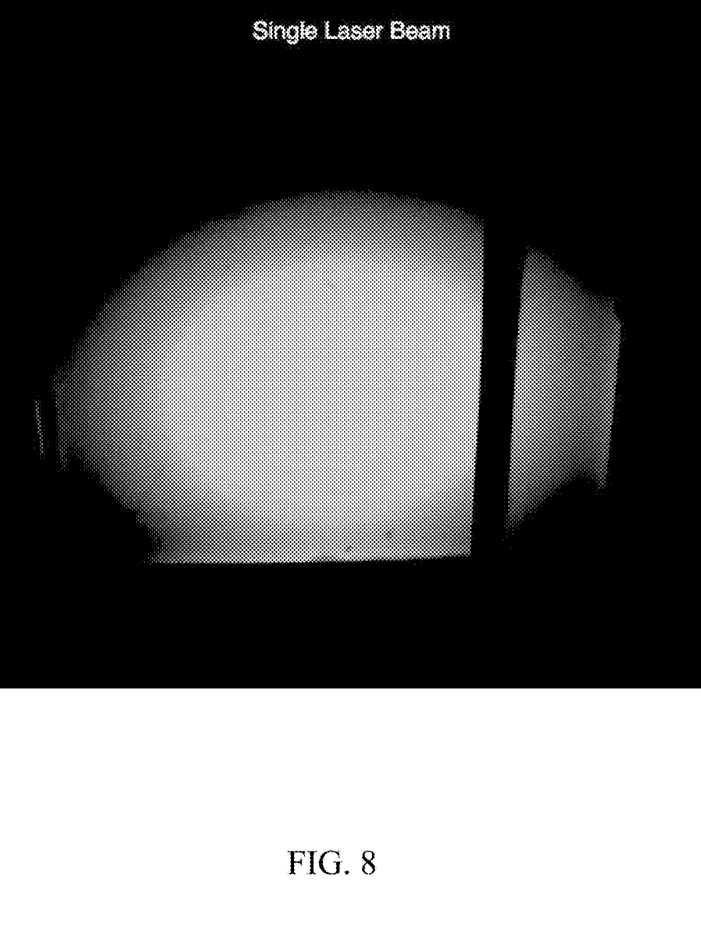
FIG. 8 is an image of perceived white light output according to the embodiment of FIG. 1.
Figure 9:
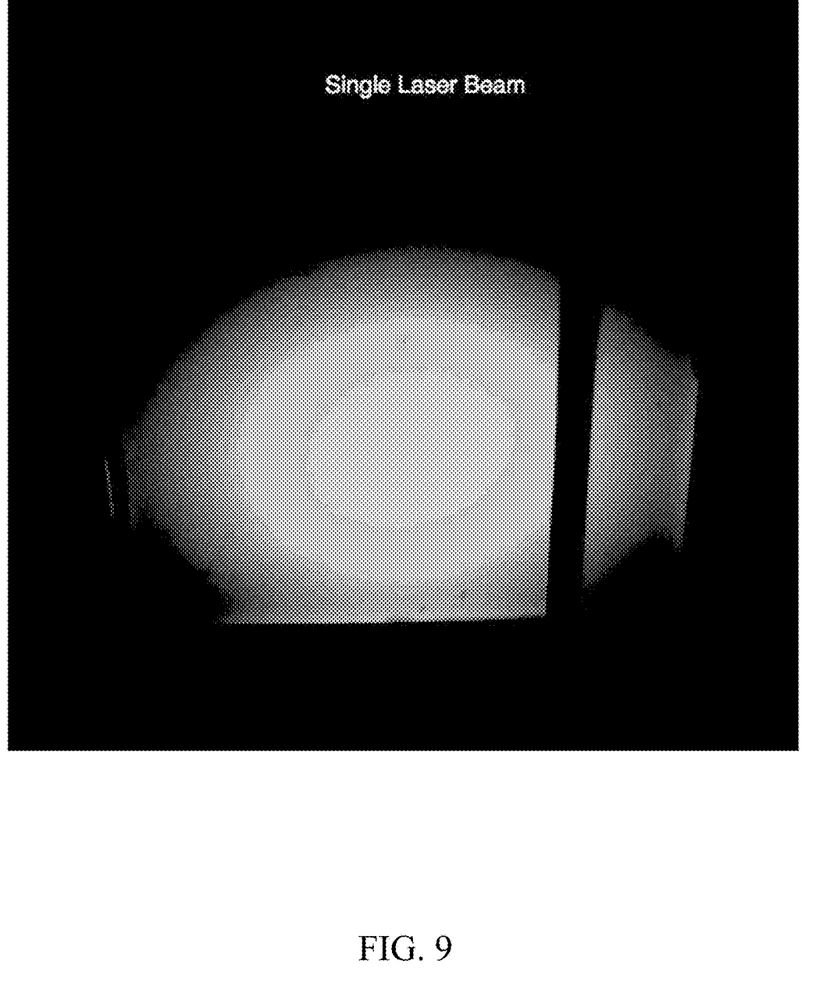
FIG. 9 is a posterized image of perceived white light output according to the embodiment of FIG. 1.

Referring now to FIG. 8, an image of perceived white light output is shown for an embodiment having a laser beam and a substrate. FIG. 9 shows a posterized image of the same. The distribution of light shown in FIGS. 8 and 9 is more preferred than that of the embodiment having only a laser diode and substrate because it has a narrower distribution. However, the distribution may be too narrow for certain emergency lighting situations.

Figure 10:
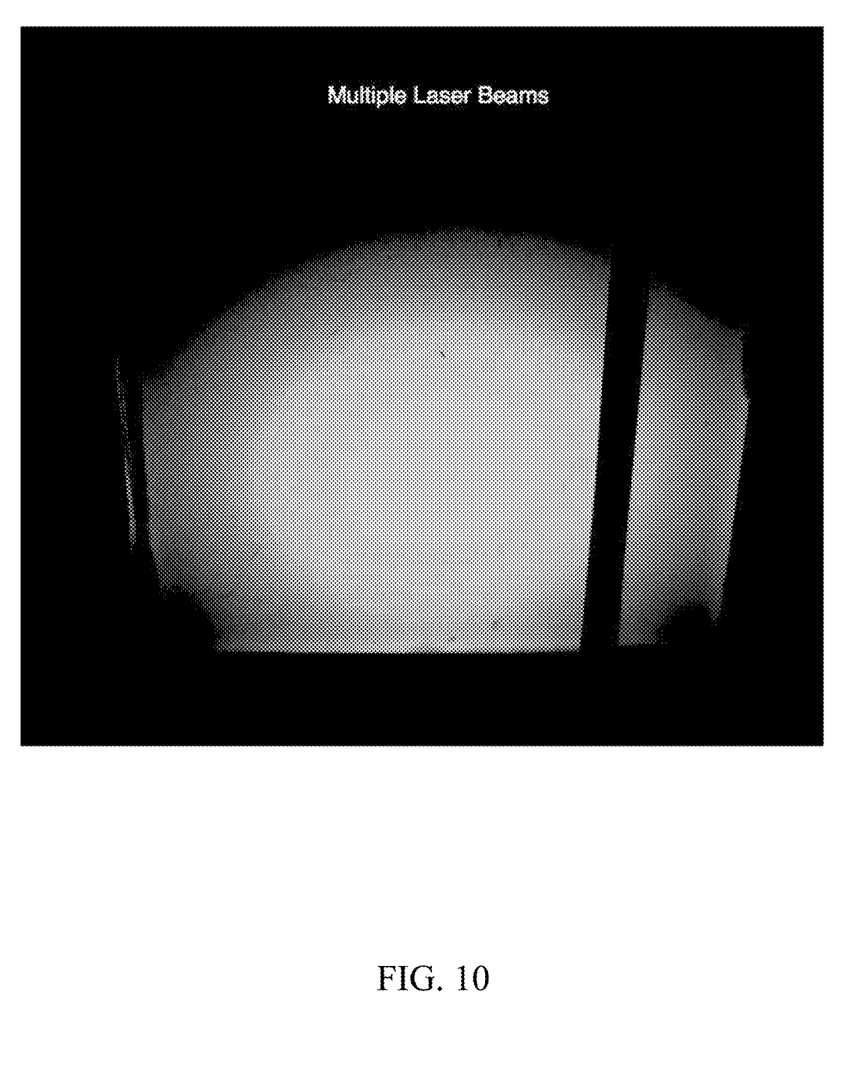
FIG. 10 is an image of perceived white light output according to the embodiment of FIG. 3.
Figure 11:
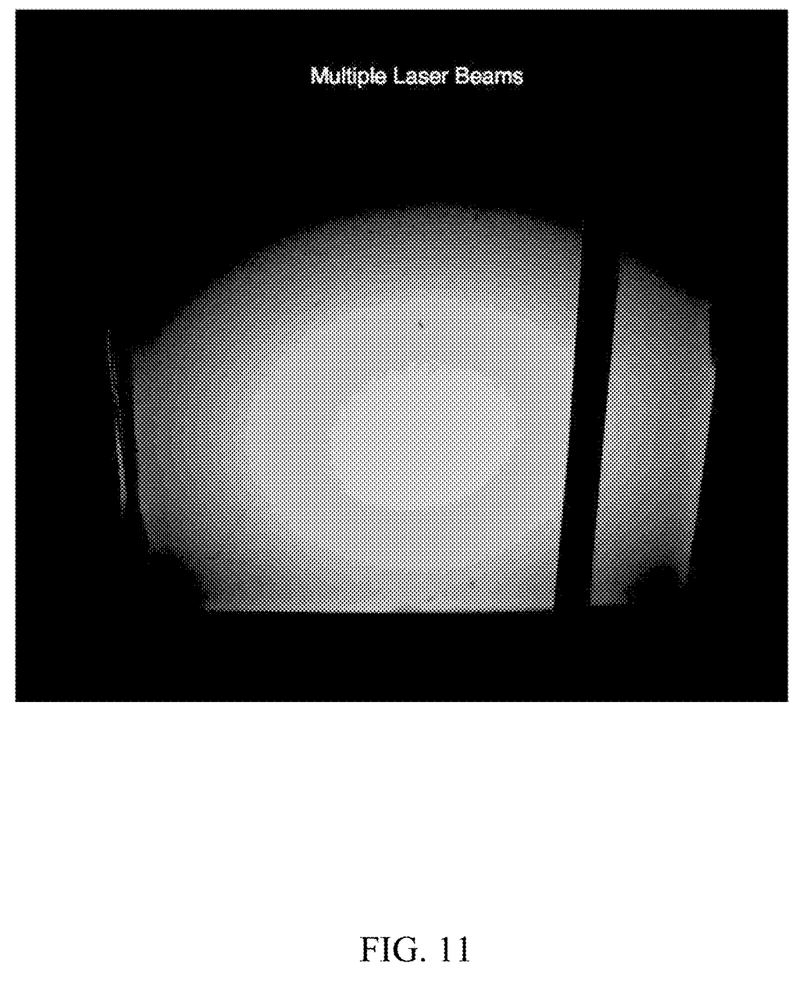
FIG. 11 is a posterized image of perceived white light output according to the embodiment of FIG. 3.

Referring now to FIG. 10, an image of perceived white light output is shown for an embodiment with multiple laser beams and a substrate. The multiple laser beams were created by a diffraction grating. FIG. 11 shows a posterized image of the same. The distribution of light shown in FIGS. 10 and 11 is most preferred because it has an ideal distribution for emergency lighting situations.

Experiments were conducted to evaluate the performance of various system configurations. A lux meter was placed at zero distance from outputs sources of perceived white light in order to capture all forward light output. Although data is presented in lux/mw as measured by the lux meter, it is not true lux/mw because the lux meter was placed at zero distance from the output sources.

The testing revealed that under certain conditions, if a single laser beam is used, the output of white light is 356 lux/mw. If under the same conditions, a diffraction grating (DG) is used to produce multiple lasers beams, the output of white light is 520 lux/mw.

The diffraction grating itself reduces the laser output from 50 mw to 32 mw, meaning only 64% of the laser power is delivered to the yellow phosphorus. However, it was observed that the efficiency of the system is higher when the diffraction grating is used, which is an unexpected result. Supporting data is tabulated below.

| Laser Diode Only Power | Lux output |
| --- | --- |
| 60 mw | 21000 lux 350 lux/mw (tested) |
| 50 mw | 17500 lux 350 lux/mw (predicted) |
| 44 mw | 15200 Lux 345 lux/mw (tested) |

| Single Laser Beam Power | Lux output |
| --- | --- |
| 50 mw | 19020 lux 380 lux/mw (tested) |
| 32 mw | 12160 lux 380 lux/mw (predicted) |
| 35 mw | 13000 lux 371 lux/mw (tested) |

| Multiple Laser Beam Power | Lux output |
| --- | --- |
| 32 mw | 16660 lux 520 lux/mw (tested), 64% efficient DG used |
| 50 mw | 26000 lux 520 lux/mw (predicted), 100% efficient DG used |
| 45 mw | 23400 lux 520 lux/mw (predicted), 90% efficient DG used |
| 23 mw | 12300 lux 534 lux/mw (tested), 64% efficient DG used |

Figure 14:
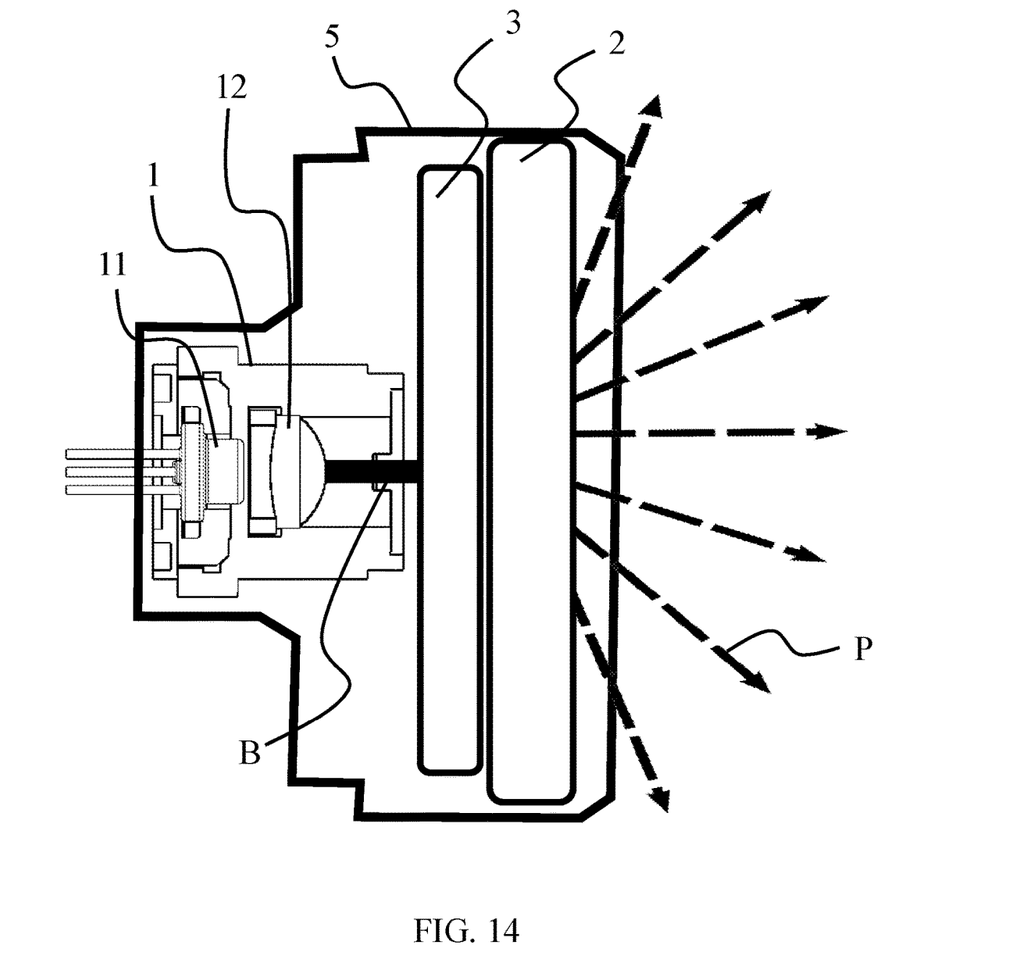
FIG. 14 is a detailed schematic of the laser lighting system with a lightbulb housing of FIG. 3.

Referring now to FIG. 14, the collimator 12 and the laser diode 11 of the laser beam source 1, the diffraction grating 3, and the clear plastic layer 21 and the phosphorous layer 22 of the substrate 2 are accommodated within a lightbulb housing 5.

While the invention is susceptible to various modifications and alternative forms, specific examples thereof have been shown in the drawings and are herein described in detail. It should be understood, however, that the invention is not to be limited to the particular forms disclosed, but to the contrary, the invention is to cover all modifications, equivalents, and alternatives falling within the scope of the present invention.

What is claimed is:

1. A lighting device comprising:
a laser beam source;
a light-penetrable substrate;
a diffraction grating;
the laser beam source comprising a laser module;
the laser module comprising a laser diode and a collimator;
the laser diode and the collimator being coupled to each other so as to render the laser module producing a single laser beam;
the light-penetrable substrate comprising a clear layer and a phosphorous layer;
the diffraction grating positioned in between the laser module and the light-penetrable substrate;
the laser module being used to impart the single laser beam substantially normal to the diffraction grating;
the diffraction grating being used to produce a plurality of point beams so as to impact a convert radiant surface of the phosphorous layer, thereby avoiding overwhelming the convert radiant surface with energy; and
the phosphorous layer being used to produce a perceived white light in a Gaussian distribution without using a forward lens or a reflector.

2. The lighting device of claim 1 comprising:
a lightbulb housing; and
the laser diode, the collimator, the clear layer, the phosphorous layer, and the diffraction grating being accommodated within the lightbulb housing.

3. The lighting device of claim 1, wherein a distance between the diffraction grating and the light-penetrable substrate is predetermined.

4. A lighting device comprising:
a laser beam source;
a light-penetrable substrate;
a diffraction grating;
the diffraction grating being positioned in between the laser beam source and the light-penetrable substrate;
the laser beam source comprising a laser module;
the laser module comprising a collimator and a laser diode;
the collimator being positioned in between the laser diode and the diffraction grating;
the collimator and the laser diode being coupled to each other so as to render the laser module being configured to impart a single laser beam substantially normal to the diffraction grating;
the diffraction grating being configured to split the single laser beam imparted from the laser module into a plurality of beams so as to avoid overwhelming the light-penetrable substrate with energy;
the light-penetrable substrate comprising a clear plastic layer and a phosphorous layer;
the clear plastic layer being positioned on one side of the phosphorous layer;
the diffraction grating positioned in between the collimator and the phosphorous layer; and
the phosphorous layer being configured to transform the plurality of beams imparted from the diffraction grating to a perceived white light in a Gaussian distribution without using any additional lenses or a reflector.

5. The lighting device of claim 4 comprising:
a distance between the diffraction grating and the light-penetrable substrate is predetermined.

6. The lighting device of claim 4 comprising:
the phosphorous layer comprising a first side and a second side;
the first side and the second side being located opposite to each other;
the first side being located adjacent to the diffraction grating;
the second side being located away from the diffraction grating; and
the clear plastic layer being positioned on one of the first side and the second side of the phosphorous layer.

7. The lighting device of claim 6 comprising:
in response to the clear plastic layer being positioned on the first side, the clear plastic layer being located in between the diffraction grating and the phosphorous layer, and the plurality of beams imparted from the diffraction grating penetrating the clear plastic layer; and
in response to the clear plastic layer being positioned on the second side, the phosphorous layer being located in between the diffraction grating and the clear plastic layer, and the perceived white light imparted from the phosphorous layer penetrating the clear plastic layer.

8. The lighting device of claim 4 comprising:
a lightbulb housing; and
the laser beam source, the diffraction grating and the light-penetrable substrate being accommodated within the lightbulb housing.

9. The lighting device of claim 8 comprising:
a lightbulb housing; and
the collimator, the laser diode, the diffraction grating, the clear plastic layer and the phosphorous layer being accommodated within the lightbulb housing.

10. A lighting device comprising:
a laser beam source;
a diffraction grating;
a light-penetrable substrate;
the diffraction grating being positioned in between the laser beam source and the light-penetrable substrate;
the laser beam source comprising a laser module;
the laser module comprising a collimator and a laser diode;
the collimator being positioned in between the laser diode and the diffraction grating;
the collimator and the laser diode being coupled to each other so as to render the laser module being configured to impart a single laser beam;
the diffraction grating being configured to split the single laser beam imparted from the laser module into a plurality of beams;
the light-penetrable substrate comprising a clear plastic layer and a phosphorous layer;
the clear plastic layer being positioned on one side of the phosphorous layer;
the diffraction grating positioned in between the collimator and the phosphorous layer; and
the phosphorous layer being configured to transform the plurality of beams imparted from the diffraction grating to a perceived white light in a Gaussian distribution without using any additional lenses or a reflector.

11. The lighting device of claim 10 comprising:
a distance between the diffraction grating and the light-penetrable substrate being less than 10 microns.

12. The lighting device of claim 10 comprising:
the phosphorous layer comprising a first side and a second side;
the first side and the second side being located opposite to each other;
the first side being located adjacent to the diffraction grating;
the second side being located away from the diffraction grating;
the clear plastic layer being positioned on one of the first side and the second side of the phosphorous layer;
in response to the clear plastic layer being positioned on the first side, the clear plastic layer being located in between the diffraction grating and the phosphorous layer; and
in response to the clear plastic layer being positioned on the second side, the phosphorous layer being located in between the diffraction grating and the clear plastic layer.

13. The lighting device of claim 10 comprising:
a lightbulb housing; and
the collimator, the laser diode, the diffraction grating, the clear plastic layer and the phosphorous layer being accommodated within the lightbulb housing.

* * * * *